United States Patent
Lin et al.

(10) Patent No.: US 10,672,903 B2
(45) Date of Patent: Jun. 2, 2020

(54) SEMICONDUCTOR DEVICE WITH DRAIN ACTIVE AREA

(71) Applicant: NXP USA, INC., Austin, TX (US)

(72) Inventors: Xin Lin, Phoenix, AZ (US); Saumitra Raj Mehrotra, Scottsdale, AZ (US); Ronghua Zhu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/044,954

(22) Filed: Jul. 25, 2018

(65) Prior Publication Data

US 2020/0035827 A1 Jan. 30, 2020

(51) Int. Cl.

| | |
|---|---|
| *H01L 29/78* | (2006.01) |
| *H01L 29/06* | (2006.01) |
| *H01L 29/08* | (2006.01) |
| *H01L 29/10* | (2006.01) |
| *H01L 29/66* | (2006.01) |

(52) U.S. Cl.
CPC ........ *H01L 29/7823* (2013.01); *H01L 29/063* (2013.01); *H01L 29/0653* (2013.01); *H01L 29/0878* (2013.01); *H01L 29/1045* (2013.01); *H01L 29/7835* (2013.01); *H01L 29/66681* (2013.01)

(58) Field of Classification Search
CPC ............. H01L 21/26513; H01L 21/761; H01L 21/76224; H01L 29/0623; H01L 29/0634; H01L 29/0649; H01L 29/0653; H01L 29/1045; H01L 29/1083; H01L 29/1095; H01L 29/402; H01L 29/47; H01L 29/66659; H01L 29/66681; H01L 29/7816; H01L 29/7835; H01L 29/063; H01L 29/0646; H01L 29/0882; H01L 29/7823

See application file for complete search history.

(56) References Cited

U.S. PATENT DOCUMENTS

| | | | |
|---|---|---|---|
| 5,306,652 A | 4/1994 | Kwon et al. | |
| 6,211,552 B1 * | 4/2001 | Efland | ................ H01L 29/7835 257/343 |
| 8,013,381 B2 * | 9/2011 | Magome | ........... H01L 21/76237 257/185 |
| 8,853,780 B2 | 10/2014 | Yang et al. | |

(Continued)

*Primary Examiner* — Mark W Tornow
*Assistant Examiner* — Priya M Rampersaud
(74) *Attorney, Agent, or Firm* — David G. Dolezal

(57) ABSTRACT

A semiconductor device includes a drain region for a transistor, a drain active area directly below the drain region, a drift area directly below an insolation structure, and an accumulation area directly below a gate structure of the transistor. The semiconductor device includes a first selectively doped implant region of a first concentration of a first conductivity type extending to a first depth. The first selectively doped implant region is located in the drift area, the drain active area, and the accumulation area. The semiconductor device includes a second selectively doped implant region of a second concentration of the first conductivity type and extending to a second depth less than the first depth. The second concentration is less than the first concentration. The second selectively doped implant region is located the drain active area, but not in the accumulation area. The second selectively doped implant region occupies a lateral portion of the drain active area that the first doped region does not occupy.

20 Claims, 7 Drawing Sheets

(56) References Cited

U.S. PATENT DOCUMENTS

| | | |
|---|---|---|
| 9,136,323 B2 | 9/2015 | Yang et al. |
| 9,299,831 B2 * | 3/2016 | Matsuda ............ H01L 29/7816 |
| 9,728,600 B2 | 8/2017 | Yang et al. |
| 2003/0001198 A1 | 1/2003 | Bromberger et al. |
| 2009/0020812 A1 * | 1/2009 | Cheng ................ H01L 29/0692 257/342 |
| 2013/0187218 A1 * | 7/2013 | Lai ..................... H01L 29/7835 257/328 |
| 2015/0270333 A1 * | 9/2015 | Yang .................. H01L 29/0649 257/337 |
| 2015/0303096 A1 | 10/2015 | Chang et al. |
| 2015/0333177 A1 * | 11/2015 | Zhang ................ H01L 29/0847 257/343 |
| 2016/0087096 A1 * | 3/2016 | Yang .................. H01L 29/7824 257/339 |
| 2016/0240662 A1 | 8/2016 | Park et al. |
| 2018/0151723 A1 | 5/2018 | Grote et al. |

* cited by examiner

_US 10,672,903 B2_

SEMICONDUCTOR DEVICE WITH DRAIN ACTIVE AREA

BACKGROUND OF THE INVENTION

Field of the Invention

This invention relates in general to a semiconductor device with a drain active area.

Description of the Related Art

Some transistors such as LDMOS transistors typically include a drift region between the drain region and the channel region under a surface isolation structure between the drain region and the channel region.

FIG. 1 is a partial cutaway side view of an integrated circuit 101 including two transistors 103 and 105 with a shared N-type drain region 121. Transistor 103 includes an N-type source region 117, N-type source extension 119, and gate structure 107. Transistor 105 includes N-type source region 125, N-type source extension 123, and gate structure 109. Integrated circuit 101 includes a P-type epitaxial layer 147 formed on a buried insulator layer 149 which is located on a N-type substrate layer 151. Located in layer 147 are P wells 137 and 139, N region 141 and N regions 143 and 145. Integrated circuit 101 also includes P-type body contact regions 115 and 127. Integrated circuit 101 also includes isolation ring 153 and isolation structures 129, 131, 133, and 135.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a semiconductor device includes a drain region for a transistor, a drain active area directly below the drain region, a drift area directly below an insolation structure, and an accumulation area directly below a gate structure of the transistor. The semiconductor device includes a first selectively doped implant region of a first concentration of a first conductivity type extending to a first depth. The first selectively doped implant region is located in the drift area, the drain active area, and the accumulation area. The semiconductor device includes a second selectively doped implant region of a second concentration of the first conductivity type and extending to a second depth less than the first depth. The second concentration is less than the first concentration. The second selectively doped implant region is located the drain active area, but not in the accumulation area. The second selectively doped implant region occupies a lateral portion of the drain active area that the first doped region does not occupy.

Figure 1:
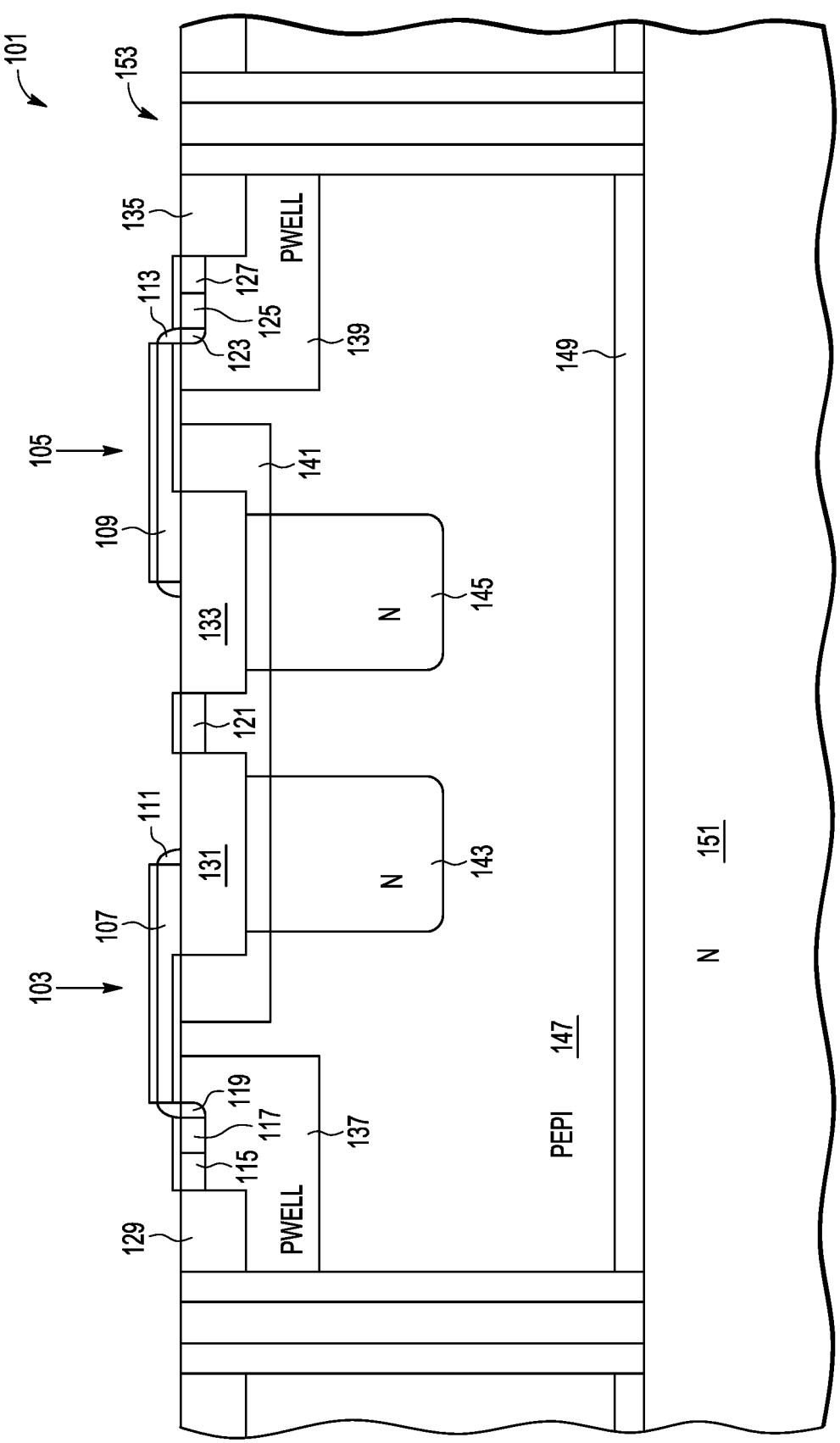
FIG. 1 is a partial cutaway side view of a prior art semiconductor device.
Figure 2:
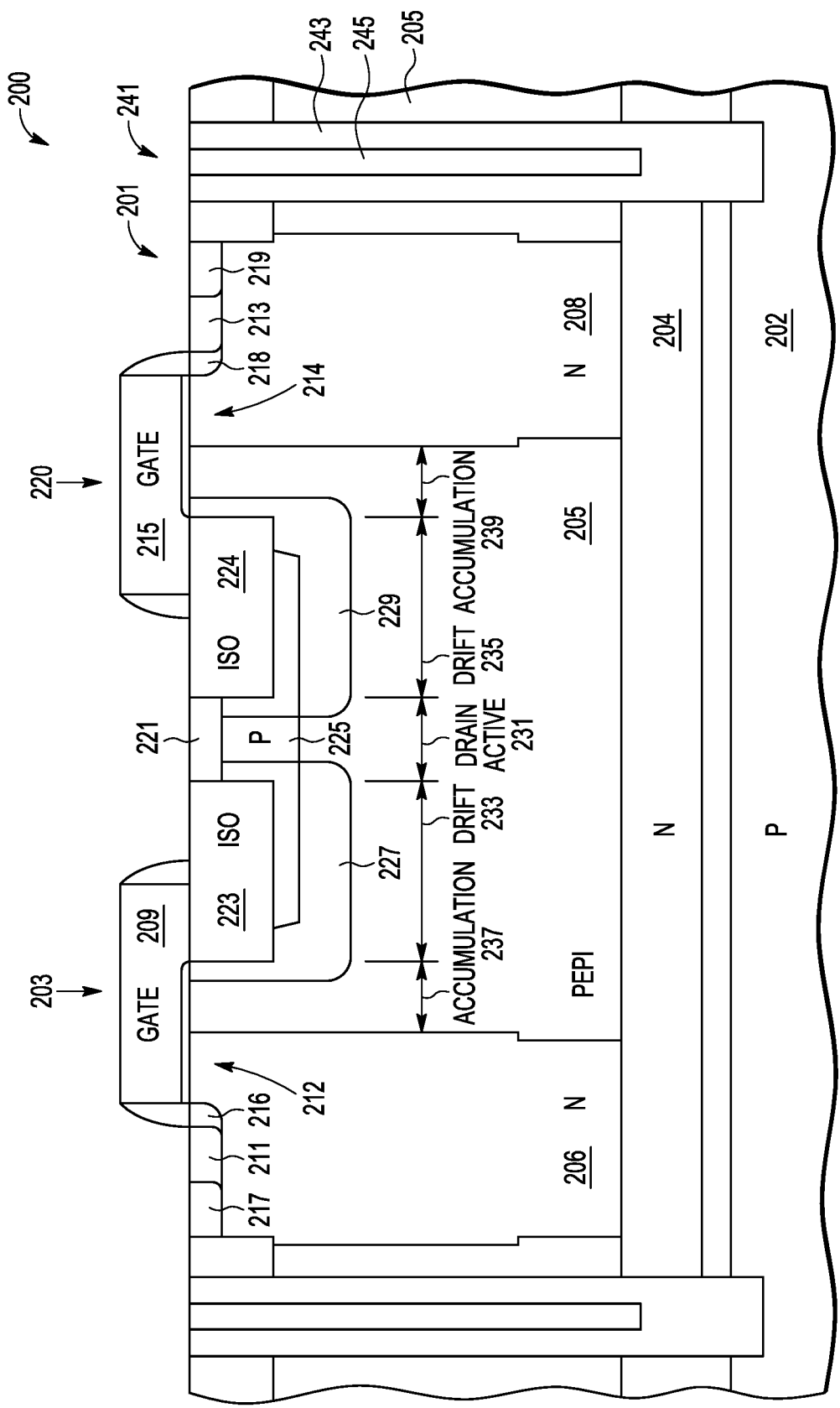
FIG. 2 is a partial cutaway side view of a semiconductor device according to one embodiment of the present invention.

FIG. 2 is a partial cutaway side view of a semiconductor device according to one embodiment of the present invention. The semiconductor device is located in an integrated circuit 200. Integrated circuit 200 includes two transistors 203 and 220. In one embodiment, transistors 203 and 220 are characterized as LDMOS transistors. Transistor 203 includes a gate structure 209 and transistor 220 includes a gate structure 215. Integrated circuit 200 includes substrate 201 which includes various structures, layers, regions, and areas. Substrate 201 includes a substrate layer 202 and an EPI layer 205 formed by multiple epitaxial processes on layer 202 in one embodiment. In the embodiment shown, both substrate layer 202 and EPI layer 205 are doped with P-type conductivity dopants (e.g. Boron). A buried N-type region 204 is located in layer 205. N-type region 204 is selectively doped with N type conductivity dopants (e.g. phosphorous, arsenic, antimony). In one embodiment, buried region 204 functions as a resurf layer to improve the device breakdown voltage by depleting the drift region. In some embodiments, buried region 204 also functions as an isolation layer to achieve high side capability and junction isolation. Layer 205 includes two N-type wells 206 and 208 that bias buried region 204 with a voltage provided to body contact regions 217 and 219, respectively. Transistor 203 includes a P-type source region 211, P-type source extension region 216, and channel region 212 which is located in N well 206. Transistor 220 includes a P-type source region 213, P-type source extension region 218, and channel region 214 which is located in well 208. Isolation structures 223 and 224 are made of a dielectric material (e.g. oxide) and are located in layer 205. Both transistor 203 and transistor 220 include a shared drain region 221 located laterally between isolation structures 223 and 224. Drain region 221 has a P-type doping. In the embodiment shown, an isolation structure 241 surrounds transistors 203 and 220 for isolation. Structure 241 includes a conductive material 245 (e.g. polysilicon) within a dielectric material 243. In some embodiments, structure 241 extends relatively deeper into layer 202 than shown in FIG. 2. Not shown in FIG. 2 are the interconnects and dielectrics located above substrate 201.

As shown in FIG. 2, substrate 201 includes a drain active area 231, drift areas 233 and 235, and accumulation areas 237 and 239. Drain active area is an area of substrate 201 directly below drain region 221. Drift area 233 is an area directly below isolation structure 223, and drift area 235 is an area of under isolation structure 224. Accumulation area 237 is the area of substrate 201 that is laterally between N-well 206 and the location of isolation structure 223. Accumulation area 239 is the area of substrate 201 that is laterally between N-well 208 and the location of isolation structure 224.

Layer 205 includes a selectively doped P-type implant region 227 that includes a portion in the drift area 233, a portion in accumulation area 237, and a portion in the drain active area 231. Layer 205 also includes a selectively doped P-type implant region 229 that includes a portion in the drift area 235, a portion in accumulation area 239, and a portion in the drain active area 231. Regions 227 and 229 serve as accumulation regions and drift regions for transistors 203 and 220, respectively. In the embodiment shown, regions 227 and 229 each do not laterally occupy all of the drain active area 231, where there exists a lateral gap between regions 227 and 229 in drain active area 231. In some embodiments, having a lateral gap between regions 227 and 229 in drain active area (231) may improve the breakdown voltage of transistors 203 and 220.

One issue that may occur with regions 227 and 229 not laterally occupying parts of a drain active area is that the dopant distribution in the drain active area 231 may be uneven. This may lead to a nonuniform distribution of potential lines in the drain active area 231 during operation.

Layer 205 includes a selectively doped P-type region 225 located in the drain active area 231, in drift areas 233 and 235 and in shared drain region 221. Region 225 is shallower than selectively doped implant regions 227 and 229 and is formed with a lower ion implantation dose of P-type dopants than regions 227 and 229. A portion of region 225 does not laterally overlap regions 227 and 229 in drain active area 231. In some embodiments, drift areas 233 and 235 do not include a portion of selectively doped implant region 225. In still other embodiments, region 225 does not overlap regions 227 and 229 in the drain active area 231.

Providing transistors 203 and 220 with a shallower and lighter selectively doped implant region 225 in the drain active area may in some embodiments, improve the uniformity of the electric potential distribution as well as further enhance the breakdown voltage of the transistors. For example, in one embodiment, the breakdown voltage is 139 volts for transistors with a region similar to region 225 and is 131 volts for similar transistors without region 225. Furthermore, in some embodiments, adding region 225 may decrease the drift resistance and lower the specific on resistance (Rdson*A) of the transistors (e.g. by 5-6% in some embodiments). In some embodiments, adding region 225 may reduce the Kirk effect, thereby improving the safe operating area (SOA) at high gate voltages.

In some embodiments, selectively doped implant region 225 does not extend into accumulation areas 237 and 239 in that the additional doping of region 225 would increase the doping concentration of the accumulation areas, thereby lowering the breakdown voltage.

Figure 3:
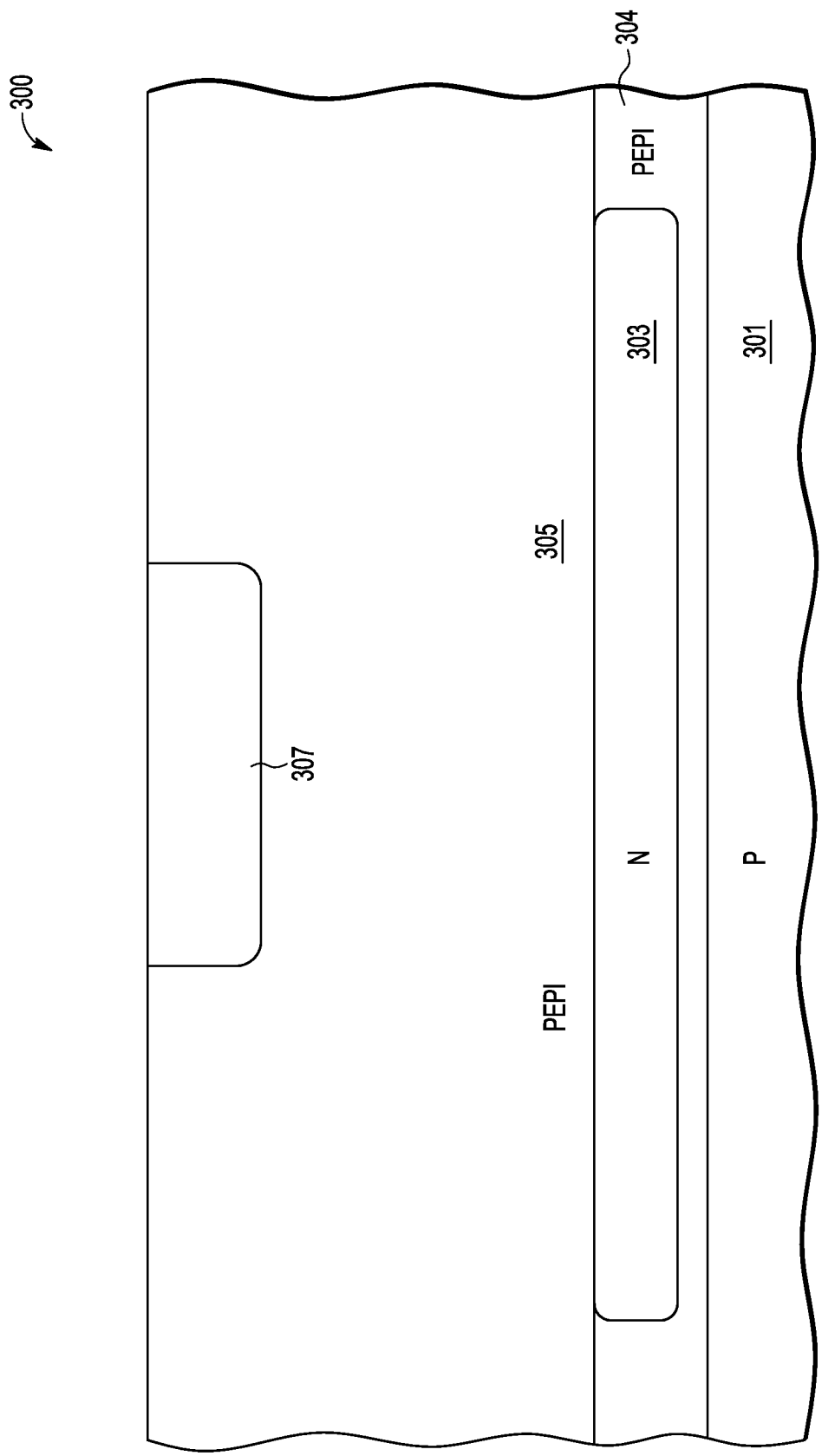
FIGS. 3-7 are partial cross-sectional side views of a wafer at various stages during the manufacture of a semiconductor device according to one embodiment of the present invention.

FIGS. 3-7 sets forth a partial cross-sectional side view of a wafer 300 in making a pair of transistors with a drain active area with two selective implant regions. In FIG. 3, wafer 300 includes a substrate layer 301, an epitaxial layer 304 grown on layer 301, and an epitaxial layer 305 grown on layer 304. In the embodiment shown, layers 301, 304, and 305 are doped with a P-type dopant (e.g. Boron). Layer 301 has a doping concentration in the range of 1e14-1e16 $cm^{-3}$ and layers 304 and 305 have doping concentrations in the range of 1e14-1e16 $cm^{-3}$, but in other embodiments, they may have other doping concentrations. In one embodiment, layers 304 and 305 are doped in-situ during their epitaxial formation. A buried N region 303 is implanted into layer 304 prior to the formation of layer 305. In one embodiment, region 303 is implanted at an energy in the range of 250 KeV to 1.0 MeV and at a dosage in the range of 1e12 to 2e13 $cm^{-2}$, but may be implanted at other dosages and at other energies in other embodiments. In one embodiment, region 303 is formed in a bulk silicon substrate (not shown). Although in the embodiment shown, layer 305 is thicker than layer 304, in other embodiments, layer 304 is thicker than layer 305.

Selectively doped implant region 307 is formed by implanting P-type dopants into layer 305. In one embodiment, region 307 is formed by implanting P-type dopants at an energy in the range of 25 KeV to 250 KeV and a dosage in the range of 5e11 to 1e13 $cm^{-2}$, but may be implanted at other energies and other dosages in other embodiments. In one embodiment, the implant for forming region 307 also implants lightly doped drain areas of analog and logic transistors (not shown) at other locations of wafer 300. In other embodiments, the implant for forming region 307 is used to adjust the threshold voltage of memory bit cells (not shown) at other locations of wafer 300. Region 307 will serve as one of the selectively doped implants in the drain active area.

Figure 4:
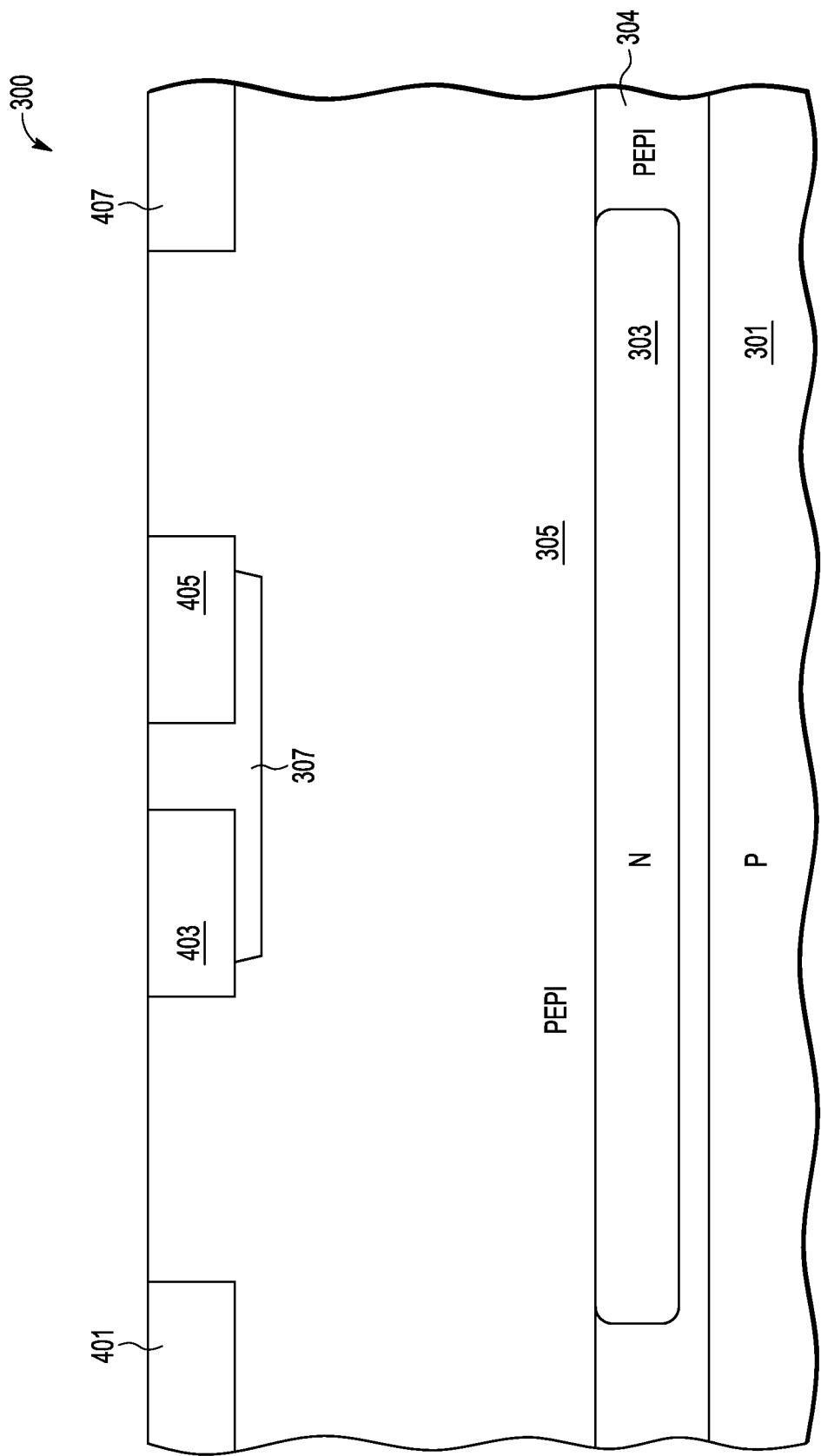

FIG. 4 shows a partial cutaway side view of wafer 300 after isolation structures 401, 403, 405, and 407 are formed in layer 305. In one embodiment, the isolation structures are formed by forming trenches in layer 305 and then filling the trenches with a dielectric material (e.g. silicon oxide). In the embodiment shown, a portion of region 307 is removed during the formation of the isolation structures. In other embodiments, structures 401, 403, 405, and 407 can be formed by other methods such as by a LOCUS method.

Figure 5:
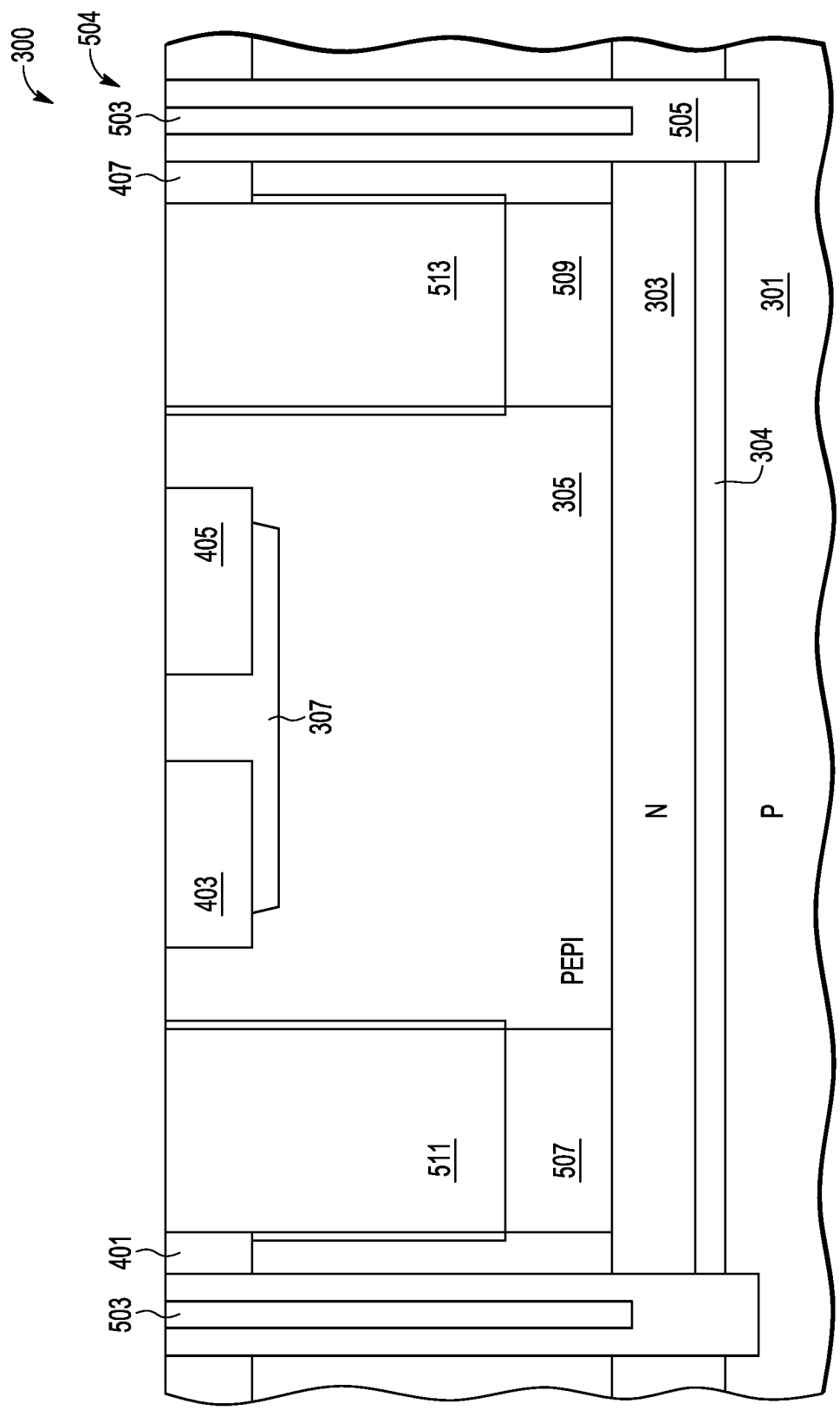

FIG. 5 shows a partial cutaway side view of wafer 300 after N wells 511, 513, 507, and 509 are formed in layer 305 and isolation ring 504 is formed in wafer 300 around N wells 511, 513, 507, and 509. In one embodiment, wells 511 and 513 are formed by a chain implant with implant energies varying from 25 KeV to 1 MeV, wherein the deepest implant has an energy in the range of 500 KeV to 1 MeV and a dosage of 5e12 to 1e13 $cm^{-2}$ of N-type dopants (e.g. phosphorous, arsenic, antimony). In one embodiment, the total dosage of the chain implant is in the range of 5e12 to 2e13 $cm^{-2}$. However, wells 511 and 513 may be formed by other methods in other embodiments. In one embodiment, wells 507 and 509 are formed by implanting N-type dopants at an energy in the range of 500 KeV to 3 MeV and a dosage in the range of 5.0e12 to 5e13 $cm^{-2}$, but maybe implanted at other dosages and other energies in other embodiments. In some embodiments, only one N-well would be formed where the well would extend to buried region 303. In one embodiment, the N-well would be formed by a chain implant where the highest implant energy is in the range of 500 KeV to 3 MeV. The shallower implants of the implant chain would determine the threshold voltages (Vt) of the transistors.

Isolation ring 504 includes an insulator material 505 and a conductive material 503 formed therein. In one embodiment, ring 504 is formed by forming an opening in wafer 300 and then filling the opening with a layer of insulative material and a layer of conducive material. Wafer 300 is then planarized to remove the insulative material and conductive material outside of the trench. Ring 504 can be formed by other methods in other embodiments. In other embodiments, the ring 504 may include dielectric materials, air gaps, or a mixture of dielectric materials, conductive materials, and air gaps.

Figure 6:
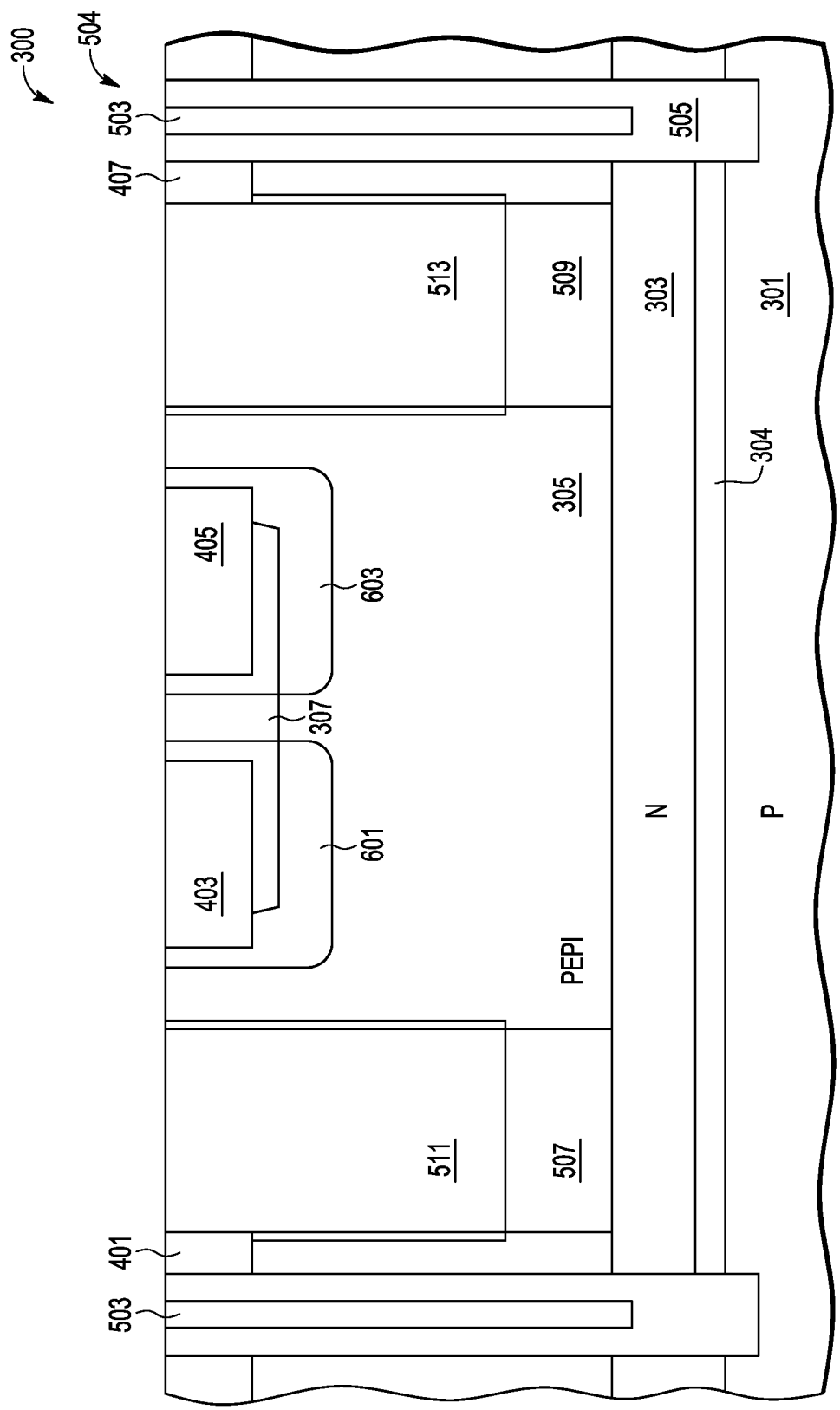

FIG. 6 shows a partial cutaway side view of wafer 300 after selectively doped implant regions 601 and 603 are formed in wafer 500. In one embodiment, regions 601 and 603 are formed by the implantation of P-type ions at an energy in the range of 15 KeV to 500 KeV and at a dosage in the range of 1.0e12 to 1e13 $cm^{-2}$, but may be implanted at other energy ranges and other dosages in other embodiments.

Figure 7:
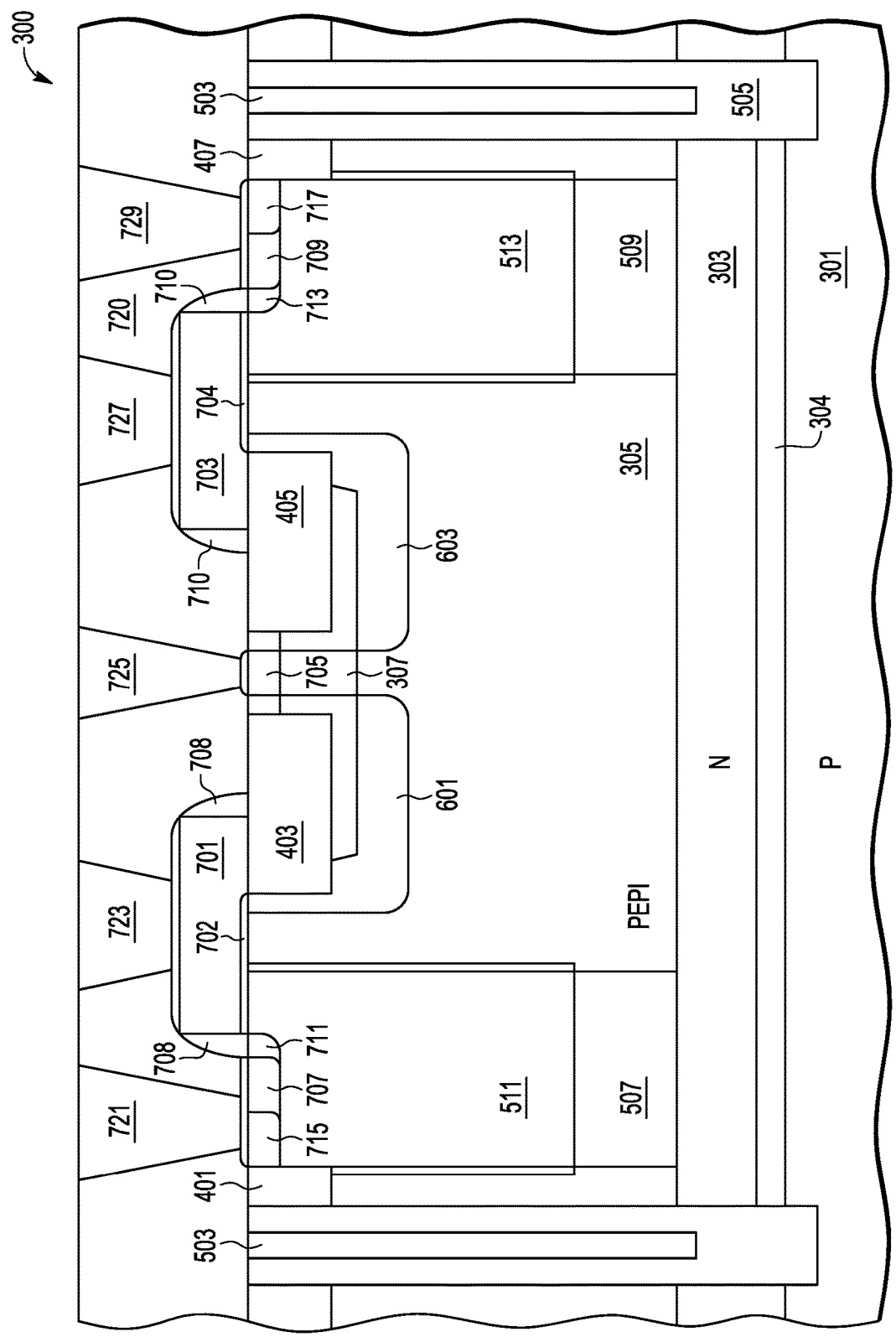

FIG. 7 shows a cutaway side view of wafer 300 during another stage in its manufacture. Gate dielectrics 702 and 704 are formed by an oxidation process of layer 305, although they may be formed by a deposition process in other embodiments. Afterwards, gate structures 701 and 703 are formed on wafer 300. In one embodiment, structures 701 and 703 are formed by forming a layer of gate material (e.g. polysilicon, metal) on wafer 300 and then patterning the layer. Source extensions 711 and 713 are formed by implanting P-type dopants into layer 305. Spacers 708 and 710 are formed on the sidewalls of gate structures 701 and 703. P-type dopants are implanted to form source regions 707 and 709 and shared drain region 705. N-type dopants are implanted to form body contact regions 715 and 717. Afterwards, wafer 300 is subjected to a silicidation process to form silicide on exposed semiconductor surfaces. A layer 720 of dielectric material is formed on wafer 300. Openings are formed in layer 720 wherein conductive material is formed in the openings to form contacts 721, 723, 725, 727, and 729 to contact silicide structures contacting the body contact regions (715, 717), source regions (707, 709), gate structures (701, 703), and shared drain region 705.

Afterwards, interconnect structures (not shown) are formed on wafer 300 for electrically coupling the contacts (721, 723, 725, 727, and 729) to other conductive structures and to external terminals (e.g. bond pads (not shown)) formed on wafer 300. Wafer 300 is then singulated into multiple integrated circuits, each including at least two transistors with a shared drain region and two selectively doped implant regions (region 307 and regions 601 and 603) in the drain active areas for each transistor. Each integrated circuit can include other semiconductor devices as well including other transistors and/or analog components. The integrated circuits are then packaged to form integrated circuit packages that can be used in electronic systems (e.g. computers, industrial control equipment, automobiles).

Other integrated circuits may have other features, configurations, regions, and/or structures. For example, in some embodiments, the body contact regions (regions 217 and 219 in FIG. 2, regions 715 and 717 in FIG. 7) may be located separately and/or be biased separately from the source regions (211, 213, 707, 709). Other embodiments would not include an isolation ring 504. With some such embodiments, buried N region 204, N well region 206, and N well region 208 in FIG. 2 would be more heavily doped for junction isolation from neighboring devices. In some embodiments, the transistors may be formed on a semiconductor on insulator (SOI) wafer. In other embodiments, each transistor would not share a drain region with another transistor.

Although the embodiments shown herein are PMOS devices, NMOS devices may also be made in other embodiments. For example, regions 211, 213, 221, 225, 227, and 229 would be N-type regions and wells 206 and 208 and region 204 would be P-type regions in one embodiment with NMOS transistors.

As disclosed herein, a first structure is "directly over" a second structure if the first structure is located over the second structure in a line having a direction that is perpendicular with the generally planar major side of the wafer. For example, in FIG. 2, structure 209 is directly over isolation structure 223. Gate structure 209 is not directly over structure 224. As disclosed herein, a first structure is "directly beneath" a second structure if the first structure is located beneath the second structure in a line having a direction that is perpendicular with the generally planar major side of the wafer. For example, in FIG. 2, region 227 is directly beneath gate structure 209. Region 227 is not directly beneath gate structure 215. One structure is "directly between" two other structures in a line if the two structures are located on opposite sides of the one structure in the line. For example, in FIG. 2, region 221 is located directly between structures 223 and 224 in a line in the cut away side view of FIG. 2. Region 227 is not located directly between structure 209 and structure 215 in a line. A first structure is "directly lateral" to a second structure if the first structure and second structure are located in a line having a direction that is parallel with a generally planar major side of the wafer. For example, structures 223 and 224 are directly lateral to each other. One structure is "directly laterally between" two other structures if the two structures are located on opposite sides of the one structure in a line that is parallel with a generally planar major side of the wafer. For example, in FIG. 2, region 221 is located directly laterally between structure 223 and 224.

Features specifically shown or described with respect to one embodiment set forth herein may be implemented in other embodiments set forth herein.

In one embodiment, a semiconductor device includes a gate structure located over a substrate for a transistor, a source region in the substrate of a first conductivity type for the transistor, a drain region in the substrate of the first conductivity type for the transistor, a channel region in the substrate of a second conductivity type opposite the first conductivity type for the transistor, and an isolation structure directly laterally between the drain region and the channel region. The substrate includes a drain active area directly below the drain region, a drift area directly below the isolation structure, and an accumulation area directly below the gate structure and including a portion located directly laterally between the isolation structure and the channel region. The substrate includes a first selectively doped implant region of a first concentration of dopants of the first conductivity type extending to a first depth. The first selectively doped implant region is located the drift area, the drain active area, and the accumulation area. The substrate includes a second selectively doped implant region of a second concentration of the first conductivity type and extending to a second depth less than the first depth. The second concentration is less than the first concentration. The second selectively doped implant region is located in the drain active area but not in the accumulation area. The second selectively doped implant region occupies a lateral portion of the drain active area that the first selectively doped implant region does not occupy.

In another embodiment, a semiconductor device includes a first gate structure located over a substrate for a first transistor, a second gate structure located over the substrate for a second transistor, a first source region in the substrate of a first conductivity type for the first transistor, a second source region in the substrate of the first conductivity type for the second transistor, a shared drain region in the substrate of the first conductivity type for the first transistor and the second transistor, a first channel region in the substrate of a second conductivity type opposite the first conductivity type for the first transistor, a second channel region in the substrate of the second conductivity type for the second transistor, a first isolation structure located directly laterally between the shared drain region and the first channel region, and a second isolation structure located directly laterally between the shared drain region and the second channel region. The substrate includes a drain active area directly below the shared drain region, a first drift area directly below the first isolation structure, a second drift area directly below the second isolation structure, a first accumulation area directly below the first gate structure, and a second accumulation area directly below the second gate structure. The substrate includes a first selectively doped implant region of a first concentration of the first conductivity type extending to a first depth. The first selectively doped implant region is located the first drift area, the drain active area, and the first accumulation area. The substrate includes a second selectively doped implant region of the first concentration of the first conductivity type extending to the first depth. The second selectively doped implant region is located the second drift area, the drain active area, and the second accumulation area. The second selectively doped implant region is laterally separated from the first selectively doped implant region in the drain active area. The substrate includes a third selectively doped implant region of a second concentration of the first conductivity type and extending to a second depth less than the first depth. The second concentration is less than the first concentration. The third selectively doped implant region is located in the drain active area. The third selectively doped implant region occupies a lateral portion of the drain active area that the first selectively doped implant region and the selectively second doped implant region do not occupy.

In another embodiment, a semiconductor device includes a gate structure located over a substrate for a first transistor, a source region in the substrate of a first conductivity type for the first transistor, a drain region in the substrate of the first conductivity type for the first transistor, a channel region in the substrate of a second conductivity type opposite the first conductivity type for the first transistor, and an isolation structure located directly laterally between the drain region and the channel region. The substrate includes a drain active area directly below the drain region, a drift area directly below the isolation structure, and an accumulation area directly below the gate structure. The drain active area includes a first lateral area laterally closer to the isolation structure and a second lateral area laterally further away from the isolation structure. A doping concentration of the first conductivity type of a portion of the first lateral area is higher than a doping concentration of the first conductivity type of a portion of the second lateral area. The portion of the first lateral area and the portion of the second lateral area are directly lateral to each other. The portion of the first lateral area is part of a first selectively doped implant region of the first conductivity type. The portion of the second lateral area is part of a second selectively doped implant region of the first conductivity type. The second selectively doped implant region does not include a portion in the accumulation area.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A semiconductor device comprising:
 a gate structure located over a substrate for a transistor;
 a source region in the substrate of a first conductivity type for the transistor;
 a drain region in the substrate of the first conductivity type for the transistor;
 a channel region in the substrate of a second conductivity type opposite the first conductivity type for the transistor;
 an isolation structure directly laterally between the drain region and the channel region;
 wherein the substrate includes a drain active area directly below the drain region, a drift area directly below the isolation structure, and an accumulation area directly below the gate structure and including a portion located directly laterally between the isolation structure and the channel region;
 wherein the substrate includes a first selectively doped implant region of a first concentration of dopants of the first conductivity type extending to a first depth, the first selectively doped implant region is located the drift area, the drain active area, and the accumulation area;
 wherein the substrate includes a second selectively doped implant region of a second concentration of the first conductivity type and extending to a second depth less than the first depth, the second concentration is less than the first concentration, the second selectively doped implant region is located in the drain active area but not in the accumulation area, wherein the second selectively doped implant region occupies a lateral portion of the drain active area that the first selectively doped implant region does not occupy.

2. The semiconductor device of claim 1 wherein the transistor is characterized as an LDMOS transistor.

3. The semiconductor device of claim 1 wherein the first conductivity type is a P conductivity type and the second conductivity type is an N conductivity type.

4. The semiconductor device of claim 1 wherein the first selectively doped implant region and the second selectively doped implant region are located in an epitaxial layer of the first conductivity type, wherein the epitaxial layer has a doping concentration of the first conductivity type that is lower than the second concentration.

5. The semiconductor device of claim 1 wherein the second selectively doped implant region is located in the drift area.

6. The semiconductor device of claim 1 wherein the substrate includes a buried doped region of the second conductivity type directly below the first selectively doped implant region and the second selectively doped implant region.

7. A semiconductor device of claim 1 further comprising:
 a second gate structure located over the substrate for a second transistor;
 a second source region in the substrate of the first conductivity type for the second transistor;
 a second channel region in the substrate of the second conductivity type for the second transistor;
 a second isolation structure directly laterally between the drain region and the second channel region;
 wherein the drain region is characterized as a shared drain region for the transistor and the second transistor;
 wherein the substrate includes a second drift area directly below the second isolation structure and a second accumulation area directly below the second gate structure, the second accumulation area includes a portion directly laterally between the second isolation structure and the second channel region;
 wherein the substrate includes a third selectively doped implant region of the first concentration of the first conductivity type extending to the first depth, the third selectively doped implant region is located in the second drift area, in the drain active area, and in the second accumulation area and is laterally separated from the first selectively doped implant region in the drain active area;
 wherein the second selectively doped implant region occupies a lateral portion of the drain active area that the first selectively doped implant region and the third selectively doped implant region do not occupy.

8. The semiconductor device of claim 7 wherein the isolation structure is located directly laterally on an opposite side of the drain region from the second isolation structure.

9. A semiconductor device comprising:
a first gate structure located over a substrate for a first transistor;
a second gate structure located over the substrate for a second transistor;
a first source region in the substrate of a first conductivity type for the first transistor;
a second source region in the substrate of the first conductivity type for the second transistor;
a shared drain region in the substrate of the first conductivity type for the first transistor and the second transistor;
a first channel region in the substrate of a second conductivity type opposite the first conductivity type for the first transistor;
a second channel region in the substrate of the second conductivity type for the second transistor;
a first isolation structure located directly laterally between the shared drain region and the first channel region;
a second isolation structure located directly laterally between the shared drain region and the second channel region;
wherein the substrate includes a drain active area directly below the shared drain region, a first drift area directly below the first isolation structure, a second drift area directly below the second isolation structure, a first accumulation area directly below the first gate structure, and a second accumulation area directly below the second gate;
wherein the substrate includes a first selectively doped implant region of a first concentration of the first conductivity type extending to a first depth, the first selectively doped implant region is located the first drift area, the drain active area, and the first accumulation area;
wherein the substrate includes a second selectively doped implant region of the first concentration of the first conductivity type extending to the first depth, the second selectively doped implant region is located the second drift area, the drain active area, and the second accumulation area, the second selectively doped implant region is laterally separated from the first selectively doped implant region in the drain active area;
the substrate includes a third selectively doped implant region of a second concentration of the first conductivity type and extending to a second depth less than the first depth, the second concentration is less than the first concentration, the third selectively doped implant region is located in the drain active area, wherein the third selectively doped implant region occupies a lateral portion of the drain active area that the first selectively doped implant region and the selectively second doped implant region do not occupy.

10. The semiconductor device of claim 9 wherein the first transistor and the second transistor are each characterized as an LDMOS transistor.

11. The semiconductor device of claim 9 wherein the first conductivity type is a P conductivity type and the second conductivity type is an N conductivity type.

12. The semiconductor device of claim 9 wherein the first selectively doped implant region, the second selectively doped implant region, and the third selectively doped implant region are each located in an epitaxial layer of the first conductivity type, wherein the epitaxial layer has a doping concentration of the first conductivity type that is lower than the second concentration.

13. The semiconductor device of claim 9 wherein the substrate includes a buried doped region of the second conductivity type directly below the first selectively doped implant region, the second selectively doped implant region, and the third selectively doped implant region.

14. The semiconductor device of claim 13 where the buried doped region is biased by a first body contact region electrically connected to the first source region and a second body contact region electrically connected the second source region.

15. The semiconductor device of claim 9 wherein the third selectively doped implant region is located in the first drift area and the second drift area.

16. A semiconductor device comprising:
a gate structure located over a substrate for a first transistor;
a source region in the substrate of a first conductivity type for the first transistor;
a drain region in the substrate of the first conductivity type for the first transistor;
a channel region in the substrate of a second conductivity type opposite the first conductivity type for the first transistor;
an isolation structure located directly laterally between the drain region and the channel region;
wherein the substrate includes a drain active area directly below the drain region, a drift area directly below the isolation structure, and an accumulation area directly below the gate structure;
wherein the drain active area includes a first lateral area laterally closer to the isolation structure and a second lateral area laterally further away from the isolation structure, wherein a doping concentration of the first conductivity type of a portion of the first lateral area is higher than a doping concentration of the first conductivity type of a portion of the second lateral area, wherein the portion of the first lateral area, and the portion of the second lateral area are directly lateral to each other, the portion of the first lateral area is part of a first selectively doped implant region of the first conductivity type, the portion of the second lateral area is part of a second selectively doped implant region of the first conductivity type, the second selectively doped implant region does not include a portion in the accumulation area.

17. A semiconductor device of claim 16 wherein the first selectively doped implant region extends to a further depth into the substrate than the second selectively doped implant region.

18. The semiconductor device of claim 17 wherein the first selectively doped implant region includes a portion in the accumulation area.

19. The semiconductor device of claim 17 wherein the first selectively doped implant region and the second selectively doped implant region each include a portion located in the drift area.

20. A semiconductor device of claim 16 further comprising:
a second gate structure located over the substrate for a second transistor;
a second source region in the substrate of the first conductivity type for the second transistor;
a second channel region in the substrate of the second conductivity type for the second transistor;

a second isolation structure located directly laterally between the drain region and the second channel region;

wherein the drain region is a shared drain region for the first transistor and the second transistor;

wherein the substrate includes a second drift area directly below the second isolation structure and a second accumulation area directly below the second gate structure;

wherein the drain active area includes a third lateral area closest to the second isolation structure, the second lateral area is located directly laterally between the first lateral area and the third lateral area, wherein a doping concentration of a first conductivity type of a portion of the third lateral area is higher than the doping concentration of the first conductivity type of the portion of the second lateral area, wherein the portion of the first lateral area, the portion of the second lateral area, and the portion of the third lateral area are directly lateral to each other.

* * * * *